(12) United States Patent
Takai et al.

(10) Patent No.: US 11,796,910 B2
(45) Date of Patent: Oct. 24, 2023

(54) TEMPLATE, MANUFACTURING METHOD OF TEMPLATE

(71) Applicant: Kioxia Corporation, Tokyo (JP)

(72) Inventors: Kosuke Takai, Yokohama Kanagawa (JP); Shingo Kanamitsu, Kawasaki Kanagawa (JP); Noriko Sakurai, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/467,016

(22) Filed: Sep. 3, 2021

(65) Prior Publication Data

US 2022/0299870 A1 Sep. 22, 2022

(30) Foreign Application Priority Data

Mar. 19, 2021 (JP) .................................. 2021-046305

(51) Int. Cl.
*G03F 7/00* (2006.01)
*B21D 22/02* (2006.01)
*H01J 37/317* (2006.01)

(52) U.S. Cl.
CPC ........... *G03F 7/0002* (2013.01); *B21D 22/02* (2013.01); *H01J 37/3174* (2013.01)

(58) Field of Classification Search
CPC .... G03F 7/0002; B21D 22/02; H01J 37/3174; H01J 2237/3321; B29C 33/3842; B29C 33/3857; B29C 39/26; B29K 2995/0026; B29K 2995/0029
See application file for complete search history.

(56) References Cited

U.S. PATENT DOCUMENTS

| | | | |
|---|---|---|---|
| 10,935,883 B2 | 3/2021 | Tavakkoli Kermani Ghariehali et al. | |
| 2006/0266916 A1* | 11/2006 | Miller ................... | B82Y 40/00 249/134 |
| 2007/0243279 A1* | 10/2007 | McMackin ............ | B82Y 10/00 425/385 |
| 2010/0264113 A1* | 10/2010 | Yoneda .................. | B82Y 40/00 264/494 |
| 2016/0247673 A1* | 8/2016 | Tsuji ........................ | C23F 1/16 |

(Continued)

FOREIGN PATENT DOCUMENTS

| | | |
|---|---|---|
| JP | 6167609 B2 | 7/2017 |
| JP | 2019-165095 A | 9/2019 |
| JP | 6596136 B2 | 10/2019 |

OTHER PUBLICATIONS

Panjan, Peter, Aljaž Drnovšek, Peter Gselman, Miha Čekada, and Matjaž Panjan. 2020. "Review of Growth Defects in Thin Films Prepared by PVD Techniques" Coatings 10, No. 5: 447. https://doi.org/10.3390/coatings10050447. (Year: 2020).*

*Primary Examiner* — Emmanuel S Luk
*Assistant Examiner* — Inja Song
(74) *Attorney, Agent, or Firm* — Finnegan, Henderson, Farabow, Garrett & Dunner, LLP

(57) ABSTRACT

A template according to the present embodiment is a template used in a lithography process of a semiconductor manufacturing process. A first substrate includes a first face, a second face protruded from a portion of the first face, and a lateral face being a lateral face positioned between the second face and the first face and inclined with respect to the second face at a connection portion to the second face. A first material film is provided at least on the lateral face.

4 Claims, 14 Drawing Sheets

(56) References Cited

U.S. PATENT DOCUMENTS

| | | | |
|---|---|---|---|
| 2016/0379800 A1* | 12/2016 | Ohtsu | H01J 37/32541 216/13 |
| 2019/0101822 A1* | 4/2019 | Tavakkoli Kermani Ghariehali et al. | B29C 39/26 |
| 2019/0287794 A1* | 9/2019 | Umezawa | H01L 21/02348 |
| 2020/0341370 A1* | 10/2020 | Ito | B29C 33/424 |

* cited by examiner

TEMPLATE, MANUFACTURING METHOD OF TEMPLATE

CROSS REFERENCE TO RELATED APPLICATIONS

This application is based upon and claims the benefit of priority from the prior Japanese Patent Application No. 2021-046305, filed on Mar. 19, 2021, the entire contents of which are incorporated herein by reference.

FIELD

The embodiments of the present invention relate to a template, a manufacturing method of a template, a pattern forming method, a manufacturing method of a semiconductor device, a template measuring apparatus, and a template measuring method.

BACKGROUND

A substrate for a template used in NIL (Nano Imprint Lithography) has steps on the surface in some cases. In these cases, the steps on its surface of the substrate are likely to negatively affect formation of a pattern on a template at the time of producing the template from the substrate.

DETAILED DESCRIPTION

Figure 1:
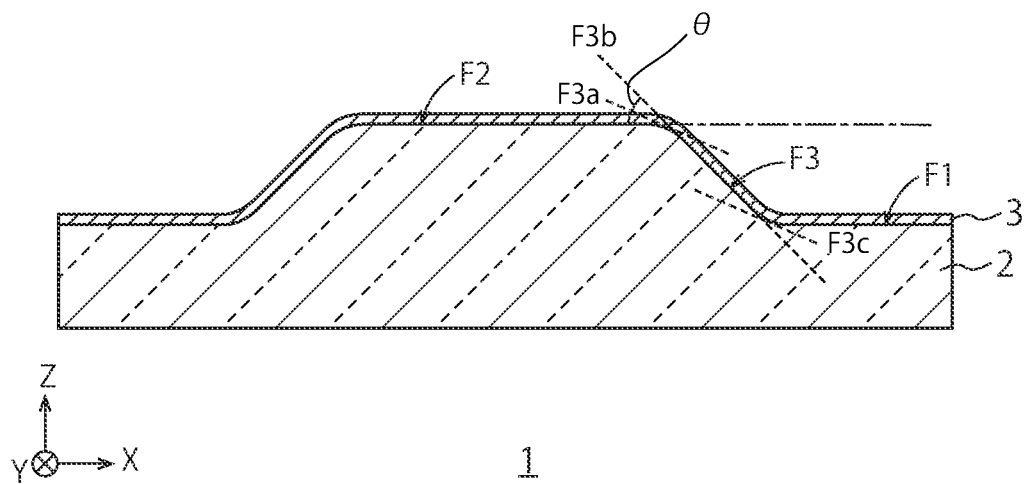
FIG. 1 is a sectional view illustrating a configuration example of a template substrate according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A template according to the present embodiment is a template used in a lithography process of a semiconductor manufacturing process. A first substrate includes a first face, a second face protruded from a portion of the first face, and a lateral face being a lateral face positioned between the second face and the first face and inclined with respect to the second face at a connection portion to the second face. A first material film is provided at least on the lateral face.

First Embodiment

Figure 2:
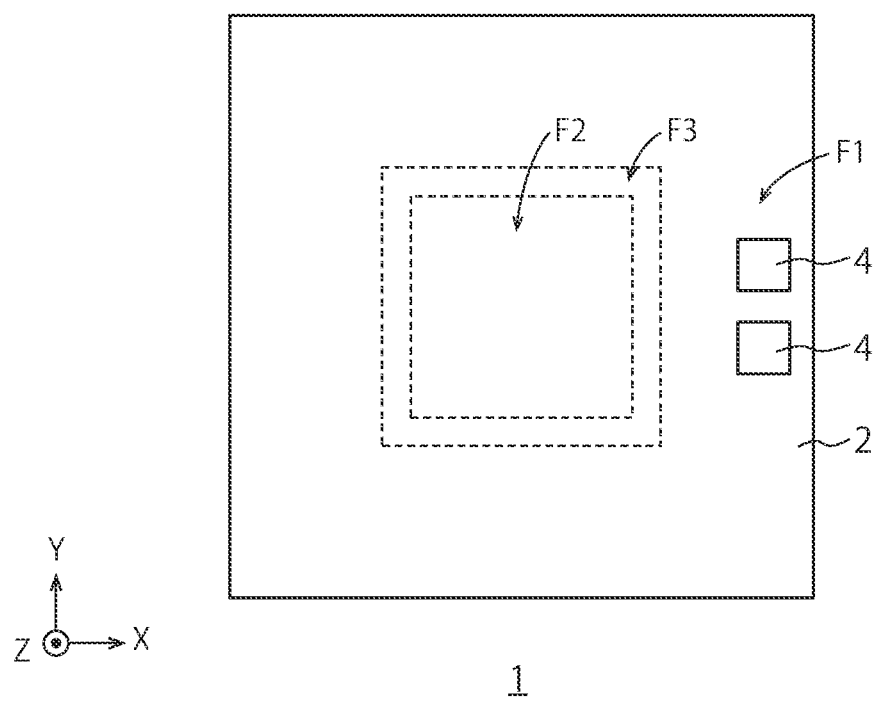
FIG. 2 is a plan view illustrating a configuration example of the template substrate according to the first embodiment.

FIG. 1 is a sectional view illustrating a configuration example of a template substrate 1 according to a first embodiment. FIG. 2 is a plan view illustrating a configuration example of the template substrate 1 according to the first embodiment. A direction perpendicular to a principle face F1 of the template substrate 1 is assumed as a Z direction. A direction orthogonal to the Z direction is assumed as an X direction and a direction orthogonal to the Z direction and the X direction is assumed as a Y direction.

The template substrate 1 is a substrate for a template (a replica template) used in the NIL (Nano Imprint Lithography) and is a so-called "template before formation of a pattern". The replica template is a so-called "template having a pattern formed thereon", which is used to transfer the pattern in a lithography process for a semiconductor wafer. For example, a translucent material such as quartz is used as the template substrate 1. The template is used, for example, to transfer a micropattern to a resist film on a semiconductor substrate (not illustrated) in a lithography process of a semiconductor manufacturing process.

The template has a mesa structure in which a face having a transfer pattern is protruded from other faces. This is to suppress contact of the template with a resist of a semiconductor wafer in regions other than the transfer pattern at the time of transfer of the pattern to the resist. Therefore, the template substrate 1 from which a template is produced also has a mesa structure.

As illustrated in FIG. 1, the template substrate 1 includes a substrate 2 being a first substrate, and a conductive film 3. The substrate 2 includes a principle face F1, a protruded face F2, and a lateral face F3. For example, a translucent material such as quartz is used as the substrate 2. The principle face F1 being a first face is a flat face substantially parallel to an X-Y plane. The protruded face F2 being a second face is protruded in the Z direction from a central portion of the principle face F1 and is a flat face substantially parallel to the X-Y plane similarly to the principle face F1. The lateral face F3 is a face connecting the principle face F1 and the protruded face F2 to each other and is provided along the periphery of the protruded face F2 as illustrated in FIG. 2. The lateral face F3 is inclined with respect to the protruded face F2 at least at a connection portion to the protruded face F2. As described above, the substrate 2 has a so-called "mesa structure" in which the protruded face F2 is protruded from the principle face F1.

The conductive film 3 is provided to cover the principle face F1, the protruded face F2, and the lateral face F3. The conductive film 3 on the protruded face F2 is electrically connected to the conductive film 3 on the principle face F1 via the conductive film 3 on the lateral face F3. Since the lateral face F3 is inclined with respect to the protruded face F2 and the principle face F1 as illustrated in FIG. 1, the material of the conductive film 3 can be sufficiently deposited on the lateral face F3 even when anisotropically sputtered from the Z direction. For example, a conductive metal such as chrome is used as the conductive film 3.

As illustrated in FIG. 2, the principle face F1 and the protruded face F2 have, for example, substantially quadrangular shapes, and have substantially square shapes or substantially rectangular shapes, respectively, in a planar view as viewed from the Z direction. Since the lateral face F3 is provided to enclose the protruded face F2 along the periphery of the protruded face F2, the lateral face F3 has a frame form in a substantially quadrangular shape. Since the lateral face F3 is inclined with respect to the protruded face F2, the whole thereof can be seen in the planar view from the Z direction.

In the present embodiment, the conductive film 3 wholly covers the principle face F1, the protruded face F2, and the lateral face F3. The conductive film 3 is provided on the lateral face F3 at the entire periphery of the protruded face F2 and is provided from the protruded face F2 to the principle face F1. Electrodes 4 are connected to portions of the conductive film 3 on the principle face F1 and can connect the conductive film 3 to the ground (a reference potential source). Accordingly, electric charges provided to the conductive film 3 on the protruded face F2 can be released from the electrodes 4 on the principle face F1 to the ground via the conductive film 3 on the lateral face F3.

If the lateral face F3 includes a substantially perpendicular face or an inversely tapered face with respect to the protruded face F2 or the principle face F1, the material of the conductive film 3 is hardly formed on the perpendicular face of the lateral face F3. In this case, the conductive film 3 on the protruded face F2 is electrically disconnected from the conductive film 3 on the principle face F1 and electric charges provided to the conductive film 3 on the protruded face F2 cannot be released.

In order to form a transfer pattern on the protruded face F2 of the template substrate 1, a resist film (not illustrated) is applied onto the protruded face F2. After a pattern is transferred to the resist film using a master template, the resist film is irradiated with an EB (electron beam). The EB irradiation can modify the resist film and enhance the processing resistant property of the resist film in dry etching. However, if the electric charges of the EB exposure are accumulated in the conductive film 3 on the protruded face F2 and unintended discharging occurs, the template substrate 1 may be damaged.

In contrast thereto, the lateral face F3 is inclined in a forward tapered manner with respect to the principle face F1 and the protruded face F2 and is covered with the conductive film 3 in the present embodiment. Accordingly, the conductive film 3 on the protruded face F2 is electrically connected to the conductive film 3 on the principle face F1 via the conductive film 3 on the lateral face F3 and electric charges provided to the conductive film 3 on the protruded face F2 can be released to the ground from the electrodes 4. As a result, charge-up of the conductive film 3 on the protruded face F2 does not occur and therefore the resist film can be sufficiently irradiated with the EB to enhance the etching resistance of the resist film.

As illustrated in FIG. 1, the principle face F1 and the protruded face F2 are parallel faces and the lateral face F3 is positioned on a line joining the principle face F1 and the protruded face F2 to each other. The inclination angle (the mesa angle) of the lateral face F3 is the maximum value of angles between tangent lines to the lateral face F3 as viewed from the Y or X direction and the protruded face F2. Tangent lines F3a, F3b, and F3c of the lateral face F3 are illustrated in the example in FIG. 1. The tangent line F3b has the maximum angle with the protruded face F2 among all the tangent lines of the lateral face F3 and this angle is defined as an inclination angle θ.

For example, when the lateral face F3 as viewed from the Y or X direction is constituted of a plurality of oblique sides, the inclination angle (mesa angle) θ of the lateral face F3 is set to a largest angle of inclination to the principle face F1 or the protruded face F2 among these oblique sides. When the lateral face F3 as viewed from the Y or X direction is constituted of a curve, the inclination angle (mesa angle) θ of the lateral face F3 is set to the maximum value among angles between the tangent lines to the lateral face F3 and the principle face F1 or the protruded face F2.

In order to enable the lateral face F3 to be a forward tapered face, the inclination angle θ of the lateral face F3 needs to be larger than zero degree and smaller than 90 degrees. In order to cause the conductive film 3 to sufficiently cover the lateral face F3, the inclination angle of the lateral face F3 is preferably between 20 degrees and 80 degrees. More preferably, the inclination angle of the lateral face F3 is between 30 degrees and 70 degrees. The lateral face F3 can be constituted of a curved face when the inclination angle θ is in the range described above. In other words, a forward taper indicates a state in which the lateral face F3 widens outwardly from the center of the protruded face F2 from the protruded face F2 toward the principle face F1 on a cross section perpendicular to the protruded face F2 as illustrated in FIG. 1.

In this way, with the inclination angle of the lateral face F3 in the range described above, the lateral face F3 can be sufficiently covered with the conductive film 3 and the conductive film 3 on the protruded face F2 can be electrically connected to the electrodes 4 on the principle face F1. Accordingly, electric charges of the conductive film 3 on the protruded face F2 can be released to the ground from the electrodes 4.

A manufacturing method of the template is explained next.

Figure 3:
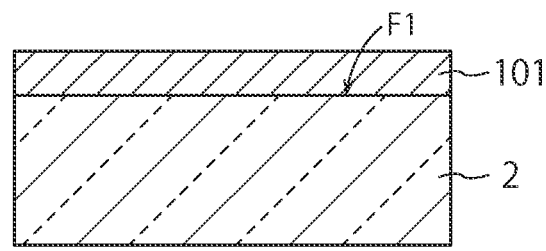
FIG. 3 is a sectional view illustrating an example of a manufacturing method of a template according to the first embodiment.

FIGS. 3 to 20 are sectional views illustrating an example of the manufacturing method of the template according to the first embodiment. First, a substrate 2 having a flat principle face F1 is prepared. As illustrated in FIG. 3, a mask material 101 is formed on the principle face F1 of the substrate 2. For example, a translucent material such as quartz is used as the substrate 2. The thickness of the substrate 2 is, for example, about 6.35 millimeters (mm). For example, a material having a high etching resistance, such as chrome is used as the mask material 101. The thickness of the mask material 101 is, for example, about 100 nanometers (nm).

Figure 4:
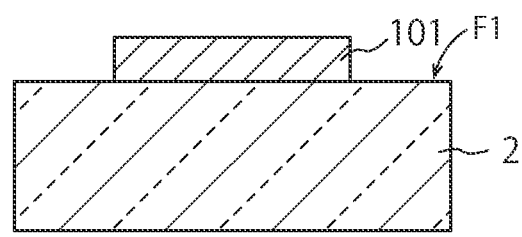
FIG. 4 is a sectional view illustrating an example of the manufacturing method of a template in continuation from FIG. 3.
Figure 5:
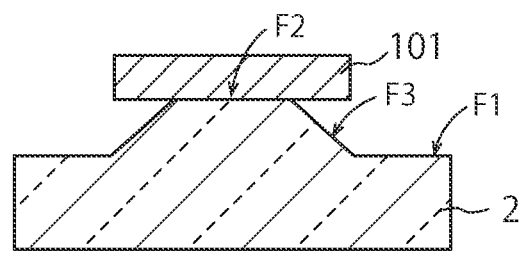
FIG. 5 is a sectional view illustrating an example of the manufacturing method of a template in continuation from FIG. 4.

Next, the mask material 101 is processed using a lithography technique and an etching technique as illustrated in FIG. 4. For example, a resist film (not illustrated) is formed on the mask material 101 and the resist film is patterned using a laser lithography method, an electron beam lithography method, a photolithography method, or the like. Next, the mask material 101 is processed by a dry etching method, or a wet etching method with a cerium nitrate aqueous solution or the like while the resist film is used as a mask. Accordingly, the structure illustrated in FIG. 4 is obtained. At this time, the mask material 101 is processed so as to place the outer edge at an outer side of the protruded face F2.

After the resist film is removed, the substrate 2 is processed with an etchant such as DHF (Diluted HydroFluoric acid) or BHF (Buffered HydroFluoric acid) while the mask material 101 is used as a mask. At this time, the substrate 2 is isotropically etched and the principle face F1 is etched in the Z direction and is etched also in the X and Y directions. Accordingly, the substrate 2 is etched also at portions under the mask material 101 and the lateral face F3 is formed as a forward tapered face. For example, when the etching has been performed for about 100 minutes using a DHF solution having a concentration reduced to 20%, the height of the protruded face F2 from the principle face F1 has been about 30 micrometers (μm) and the inclination angel of the lateral face F3 has been about 45 degrees. For example, when the etching has been performed for about 100 minutes using a BHF solution, the height of the protruded face F2 from the principle face F1 has been about 30 μm and the inclination angle of the lateral face F3 has been about 85 degrees. In this way, the inclination angle of the lateral face F3 can be controlled by changing the material of the mask material 101, the type or concentration of the etchant, or the like. While the inclination angle of the lateral face F3 can be adjusted by changing the etchant in the present embodiment, a sacrificial layer (not illustrated) such as a silicon dioxide film may be interposed between the substrate 2 and the mask material 101 as required. The inclination angle of the lateral face F3 may be controlled using a difference in the etching rate between the sacrificial film and the substrate 2.

Figure 6:
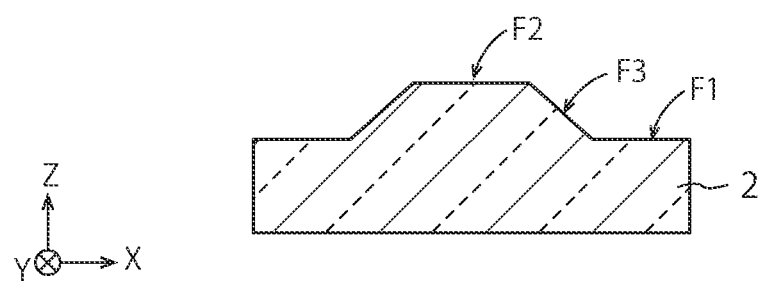
FIG. 6 is a sectional view illustrating an example of the manufacturing method of a template in continuation from FIG. 5.

Next, the mask material 101 is separated and the substrate 2 is washed. Accordingly, the substrate 2 having a mesa structure as illustrated in FIG. 6 is formed. The substrate 2 has the protruded face F2 protruded from the principle face F1, and the lateral face F3 between the principle face F1 and the protruded face F2 is inclined with respect to the protruded face F2.

Figure 7:
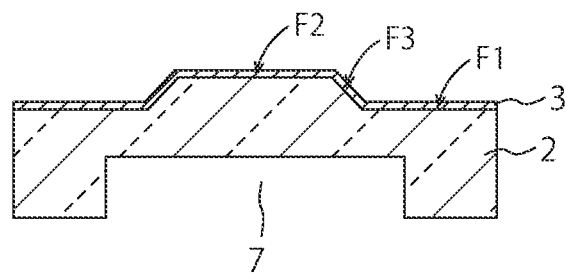
FIG. 7 is a sectional view illustrating an example of the manufacturing method of a template in continuation from FIG. 6.

Next, the rear surface of the substrate 2 on the opposite side to the principle face F1 is processed by mechanical polishing to form a core-out portion 7 as illustrated in FIG. 7. The core-out portion 7 is a recessed portion obtained by cutting out a central portion of the rear surface of the substrate 2. As illustrated in FIG. 1, the core-out portion 7 does not always need to be provided on the template substrate 1 and may be formed at a time when a template is produced from the template substrate 1.

Next, as illustrated in FIG. 7, the conductive film 3 is formed on the principle face F1, the protruded face F2, and the lateral face F3 by a reactive sputtering method or the like. While the conductive film 3 is anisotropically deposited, the conductive film 3 can be formed to cover the whole of the principle face F1, the protruded face F2, and the lateral face F3 because the lateral face F3 is inclined. The conductive film 3 can be, for example, a chrome film having a thickness of about 3 nm. Since the reactive sputtering is an anisotropic deposition method, the film thickness of the conductive film 3 differs between the flat principle or protruded face F1 or F2 and the inclined lateral face F3. Therefore, while the thicknesses of the conductive films 3 on the principle face F1 and the protruded face F2 are about 3 nm, the conductive film 3 on the lateral face F3 is less than 3 nm. For example, when the inclination angle of the lateral face F3 is 45 degrees, the resistance value between the conductive film 3 on the protruded face F2 and the electrodes 4 has been 200 kiloohms. In contrast thereto, when the inclination angle of the lateral face F3 is 85 degrees, the resistance value between the conductive film 3 on the protruded face F2 and the electrodes 4 has been 20 megaohms. In this way, it is found that the resistance value between the conductive film 3 on the protruded face F2 and the electrodes 4 is considerably increased when the inclination angel of the lateral face F3 exceeds 80 degrees. Therefore, it is preferable that the inclination angle of the lateral face F3 be equal to or less than 80 degrees in the present embodiment. On the other hand, when the inclination angle of the lateral face F3 is less than 20 degrees, the protruded face F2 is not sufficiently protruded from the principle face F1 and a sufficient mesa structure is not formed. Since other transfer patterns adjacent thereto are likely to be affected in this case, there is a risk that the function as a template in the NIL is not obtained. Therefore, the inclination angle of the lateral face F3 is preferably between 20 degrees and 80 degrees.

In order to cause the resistance value between the conductive film 3 on the protruded face F2 and the electrodes 4 to be lower than 200 kiloohms and to reduce the distance between adjacent transfer patterns, the inclination angle of the lateral face F3 may be between 30 degrees and 70 degrees, or even between 40 degrees and 60 degrees.

The template substrate 1 illustrated in FIG. 1 is completed in this way.

A process of producing a template including a pattern formed thereon using the template substrate 1 illustrated in FIG. 7 (FIG. 1) is subsequently explained.

Figure 8:
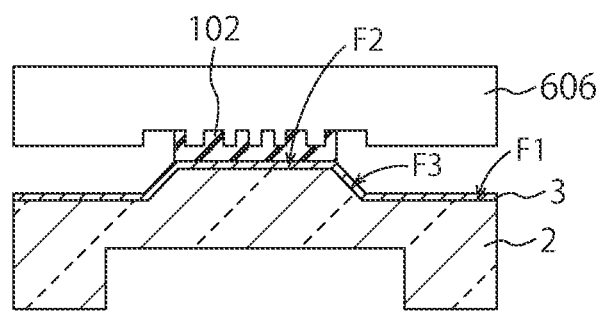
FIG. 8 is a sectional view illustrating an example of the manufacturing method of a template in continuation from FIG. 7.

A resist film 102 is formed on the conductive film 3 on the protruded face F2 and a pattern of a master template 606 are transferred to the resist film 102 by the NIL method. For example, the material of the NIL resist film 102 is dripped to the conductive film 3 from above the protruded face F2. Next, the master template 606 is pressed against the conductive film 3 on the protruded face F2 to transfer the pattern of the master template 606 to the conductive film 3 on the protruded face F2 as illustrated in FIG. 8.

Figure 9:
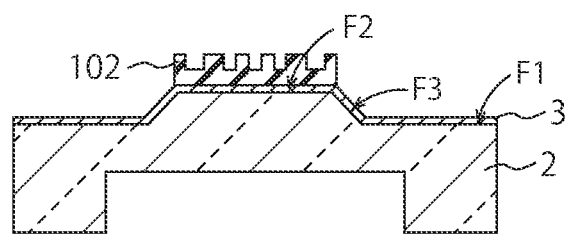
FIG. 9 is a sectional view illustrating an example of the manufacturing method of a template in continuation from FIG. 8.

Next, the NIL resist is irradiated with UV (Ultra Violet) light to cure the NIL resist and the master template 606 is then separated from the resist film 102. Accordingly, the structure illustrated in FIG. 9 is obtained. In order to avoid contact between the master template 606 and the conductive film 3, a portion of the resist film 102 may be left on the master template 606.

Figure 10:
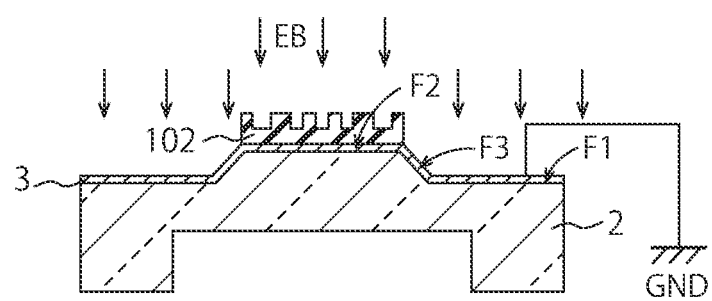
FIG. 10 is a sectional view illustrating an example of the manufacturing method of a template in continuation from FIG. 9.

Next, the resist film 102 is irradiated with an EB to modify the resist film 102 as illustrated in FIG. 10. For example, the substrate 2 is placed in vacuum and the resist film 102 above the protruded face F2 is irradiated with an EB from an electron gun positioned immediately above. This method is referred to also as "EB curing". At this time, the electrodes 4 are grounded via a probe and electric charges or electrons applied to the conductive film 3 electrically connected to the electrodes 4 are released to the ground via the electrodes 4 and the probe. When the inclination angle of the lateral face F3 is between 20 degrees and 80 degrees, the conductive film 3 on the protruded face F2 is electrically connected at a low resistance to the conductive film 3 on the principle face F1 and the electrodes 4 (see FIG. 2) via the conductive film 3 on the lateral face F3. Therefore, the electric charges of the EB irradiation are not accumulated in the conductive film 3 on the protruded face F2.

When the inclination angle of the lateral face F3 is above 80 degrees, the resistance value between the conductive film 3 on the protruded face F2 and the electrodes 4 is increased and the conductive film 3 is at a risk of being charged up. If the conductive film 3 accordingly discharges, the substrate 2 is at a risk of being damaged.

In contrast thereto, according to the present embodiment, the electric charges of the conductive film 3 on the protruded face F2 can be released to the ground. Accordingly, a template can be formed without damaging the substrate 2.

Figure 11:
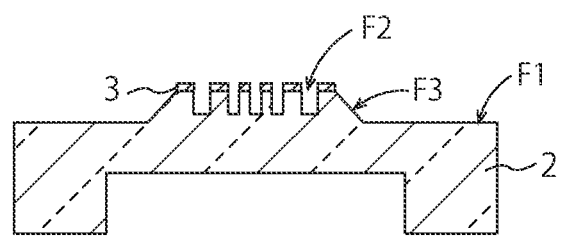
FIG. 11 is a sectional view illustrating an example of the manufacturing method of a template in continuation from FIG. 10.

Next, the pattern on the resist film 102 is transferred to the conductive film 3 by the dry etching method. Next, the substrate 2 is processed by the dry etching method using the conductive film 3 as a hard mask. Accordingly, the structure illustrated in FIG. 11 is obtained. When the resist film 102 is not sufficiently modified by the EB exposure (for example, when the inclination angle of the lateral face F3 is above 80 degrees), the pattern on the resist film 102 is lost during the processing and the pattern is not accurately transferred to the conductive film 3. In contrast thereto, when the resist film 102 is sufficiently modified by the EB exposure (for example, when the inclination angle of the lateral face F3 is equal to or less than 80 degrees), the pattern on the resist film 102 can be accurately transferred to the conductive film 3 and the substrate 2.

Figure 12:
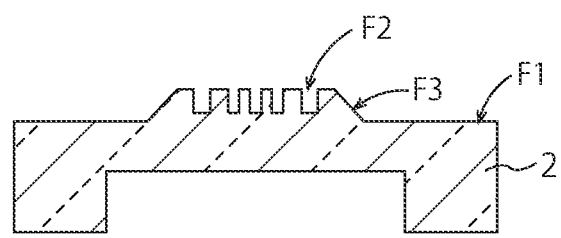
FIG. 12 is a sectional view illustrating an example of the manufacturing method of a template in continuation from FIG. 11.

Next, as illustrated in FIG. 12, the conductive film 3 serving as the hard mask is separated and the substrate 2 is washed. Accordingly, a pattern is formed on the protruded face F2 of the template. Next, the pattern of the template is measured and inspected as required.

After the processes illustrated in FIGS. 11 and 12, a mask that exposes a peripheral portion of the protruded face F2 while covering the pattern formed on the protruded face F2 may be further formed to partially etch the peripheral portion of the protruded face F2. Accordingly, an upper portion of the lateral face F3 is partially etched and a lateral face having a plurality of faces is formed. That is, a multi-step mesa structure is formed.

Figure 13:
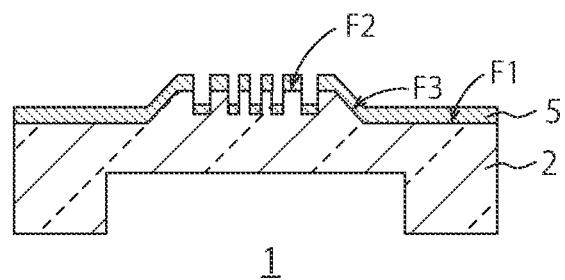
FIG. 13 is a sectional view illustrating an example of the manufacturing method of a template in continuation from FIG. 12.

Next, the material of a light-shielding film 5 is deposited on the principle face F1, the protruded face F2, and the lateral face F3 of the template substrate 1 as illustrated in FIG. 13. For example, a light-shielding conductive material such as chrome is used as the material of the light-shielding film 5. For example, the material of the light-shielding film 5 may be a chrome film having a thickness of 120 nm. At this time, the material of the light-shielding film 5 is deposited also on the upper surface and the bottom surface of the pattern on the protruded face F2.

Figure 14:
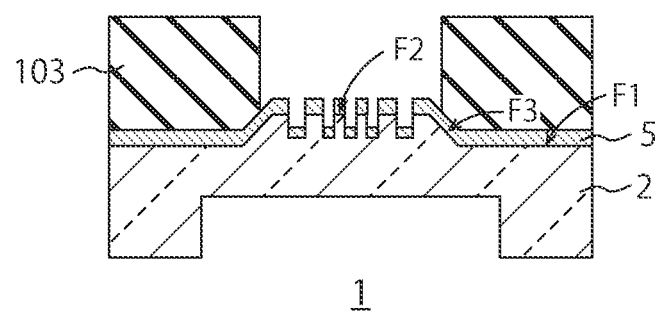
FIG. 14 is a sectional view illustrating an example of the manufacturing method of a template in continuation from FIG. 13.

Next, a resist film 103 is applied onto the principle face F1, the protruded face F2, and the lateral face F3, printing is performed to the resist film 103 on the protruded face F2 and a portion of the resist film 130 on the lateral face F3 using the laser lithography method, and development is performed. Accordingly, the resist film 103 is patterned and the material of the light-shielding film 5 on the protruded face F2 and the material of the light-shielding film 5 on the portion (an upper portion) of the lateral face F3 are exposed as illustrated in FIG. 14.

Figure 15:
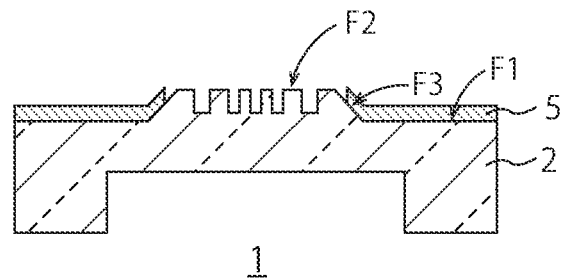
FIG. 15 is a sectional view illustrating an example of the manufacturing method of a template in continuation from FIG. 14.

Next, the material of the light-shielding film 5 is processed by the dry etching method while the resist film 103 is used as a mask. Accordingly, the material of the light-shielding film 5 on the protruded face F2 and the material of the light-shielding film 5 on the portion (the upper portion) of the lateral face F3 are removed as illustrated in FIG. 15. The material of the light-shielding film 5 deposited on the pattern of the protruded face F2 is also removed. Therefore, the light-shielding film 5 remains on a region from a middle portion of the lateral face F3 to the lower portion thereof and on the principle face F1.

Figure 16:
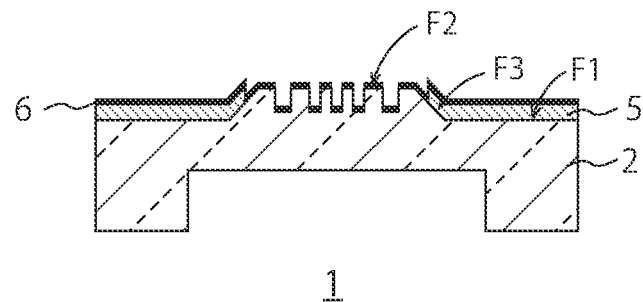
FIG. 16 is a sectional view illustrating an example of the manufacturing method of a template in continuation from FIG. 15.

Next, a mark film 6 is formed on the principle face F1, the protruded face F2, and the lateral face F3 as illustrated in FIG. 16. The mark film 6 is formed on the protruded face F2 and the portion (the upper portion) of the lateral face F3, and on the light-shielding film 5. The mark film 6 is formed also on the upper surface and the bottom surface of the pattern on the protruded face F2. For example, a light-shielding conductive material such as chrome is used as the mark film 6. The material of the mark film 6 can be, for example, a chrome film having a thickness of about 10 nm. The mark film 6 serves as an alignment mark required when the pattern is transferred to a semiconductor wafer.

A resist film 104 is formed on the mark film 6 on the protruded face F2 and the upper portion of the lateral face F3, and a pattern of a master template 607 is transferred to the resist film 104 by the NIL method. For example, the material of the resist film 104 for the NIL is dripped to the mark film 6 from above the protruded face F2. At this time, the material of the resist film 104 is dripped to a region where the light-shielding film 5 is not provided on the protruded face F2 and the lateral face F3. The material of the resist film 104 may be provided to overlap to some extent with an end portion of the light-shielding film 5 on the lateral face F3.

Figure 17:
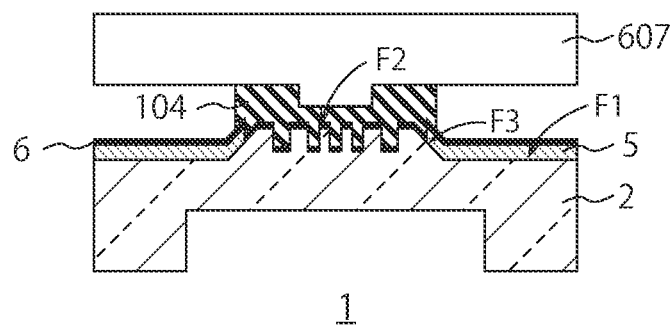
FIG. 17 is a sectional view illustrating an example of the manufacturing method of a template in continuation from FIG. 16.

Next, the master template 607 is impressed in the resist film 104 on the protruded face F2 and the lateral face F3 and the pattern on the master template 607 is transferred to the resist film 104 on the protruded face F2 as illustrated in FIG. 17. In order to cause the resist film 104 at an end portion of the pattern serving as an alignment mark to remain, the master template 607 has a convex portion at a location corresponding to a center portion of the pattern on the protruded face F2.

Figure 18:
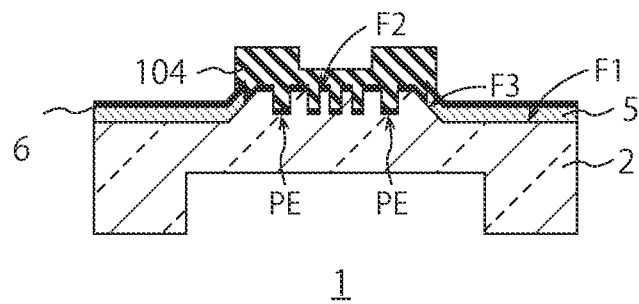
FIG. 18 is a sectional view illustrating an example of the manufacturing method of a template in continuation from FIG. 17.

Next, the resist film 104 is irradiated with UV light to cure the resist film 104, and the master template 607 is subsequently separated from the resist film 104. Accordingly, the structure illustrated in FIG. 18 is obtained. The resist film 104 is formed thickly from the upper portion of the lateral face F3 to an end pattern PE used as the alignment mark of the pattern on the protruded face F2 and is formed relatively thinly in a pattern region other than the end pattern PE.

Figure 19:
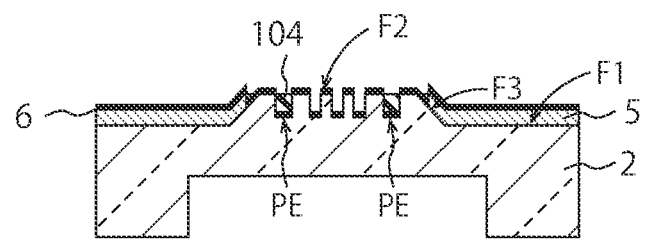
FIG. 19 is a sectional view illustrating an example of the manufacturing method of a template in continuation from FIG. 18.

Next, the resist film 104 is etched back as illustrated in FIG. 19. This causes the resist film 104 to remain on the end pattern PE and the upper portion of the lateral face F3 and to be removed from the pattern region other than the end pattern PE.

Figure 20:
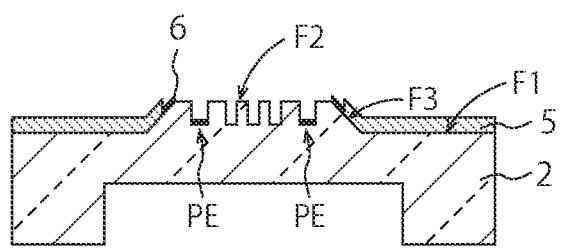
FIG. 20 is a sectional view illustrating an example of the manufacturing method of a template in continuation from FIG. 19.

Next, the mark film 6 is processed by the dry etching method while the resist film 104 is used as a mask. Accordingly, the mark film 6 remains on the end pattern PE and on a region exposed from the light-shielding film 5 in the lateral face F3 as illustrated in FIG. 20. The mark film 6 is removed from the pattern region in the central portion of the protruded face F2. This enables the mark film 6 to remain on the end pattern PE, and enables the lateral face F3 and the principle face F1 to be covered with the light-shielding film 5 or the mark film 6 as illustrated in FIG. 20. Since, for example, chrome is used as the mark film 6, the mark film 6 can also function as a light-shielding film. Accordingly, the template 10 according to the present embodiment is completed.

The template 10 is pressed against an NIL resist film applied onto a semiconductor wafer (not illustrated). At this time, the resist film is cured by irradiation of UV light and the template 10 is subsequently separated from the resist film. The pattern on the protruded face F2 is transferred to the resist film by this transfer processing. The same pattern can be transferred to the resist film on the semiconductor wafer by repeatedly performing this transfer processing.

When the transfer processing is repeated, static electricity is generated due to friction between the resist film and the template 10. The template 10 according to the present embodiment is covered with the conductive light-shielding film 5 and the mark film 6 on the lateral face F3 and the principle face F1. Therefore, electric charges of the static electricity can be released from the electrodes 4 to the ground via the light-shielding film 5 and the mark film 6. Accordingly, the charge-up on the template 10 can be suppressed and the life of the template 10 can be elongated.

While the same material (for example, chrome) is used for the light-shielding film 5 and the mark film 6, the materials thereof are not limited thereto and different conductive materials may be used for the light-shielding film 5 and the mark film 6, respectively.

Second Embodiment: Template Substrate 1

Figure 21:
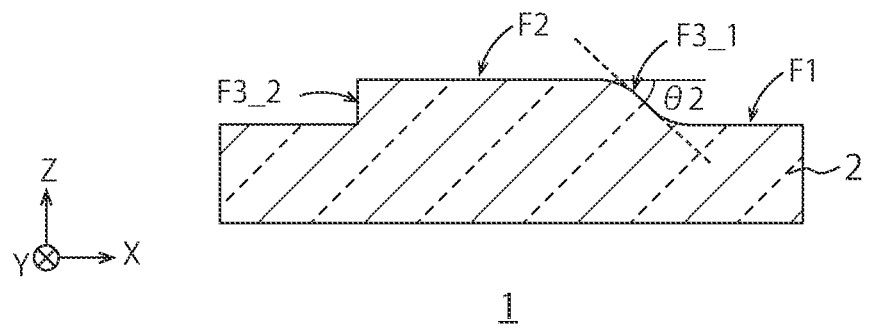
FIG. 21 is a sectional view illustrating a configuration example of a template substrate according to a second embodiment.
Figure 22:
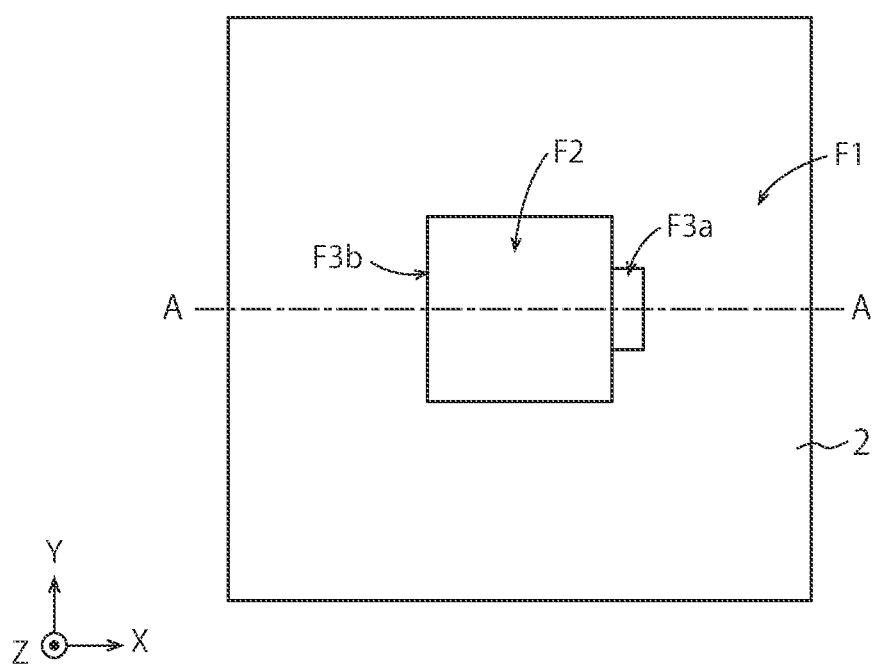
FIG. 22 is a plan view illustrating a configuration example of the template substrate according to the second embodiment.
Figure 23:
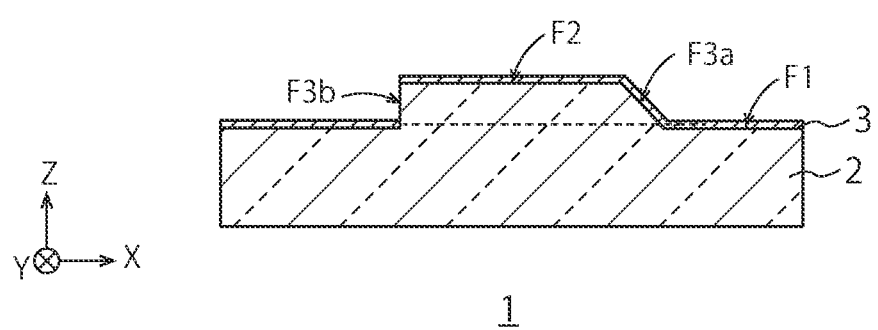
FIG. 23 is a sectional view illustrating a configuration example of a template substrate including a conductive film.

FIG. 21 is a sectional view illustrating a configuration example of the template substrate 1 according to a second embodiment. FIG. 22 is a plan view illustrating a configuration example of the template substrate 1 according to the second embodiment. FIG. 21 illustrates a cross section along a line A-A in FIG. 22. FIG. 23 is a sectional view illustrating a configuration example of the template substrate 1 including the conductive film 3.

In the second embodiment, the lateral face F3 is inclined in a forward tapered manner with respect to the protruded face F2 or the principle face F1 at a lateral face portion F3a connecting to one portion of the periphery of the protruded face F2 as illustrated in FIG. 22. That is, an inclination angle θ2 at the lateral face portion F3a is between 20 degrees and 80 degrees. Meanwhile, a lateral face portion F3b other than the lateral face portion F3a includes portions substantially perpendicular or inversely tapered with respect to the protruded face F2 or the principle face F1.

In the template substrate 1 described above, the conductive film 3 is not deposited on the lateral face portion F3b in some cases while deposited on the lateral face portion F3a being an inclined face in the forward tapered manner, as illustrated in FIG. 23. Therefore, the conductive film 3 on the protruded face F2 is continuously and electrically connected to the conductive film 3 on the principle face F1 via the conductive film 3 on the lateral face portion F3a. Accordingly, electric charges produced by the EB irradiation explained with reference to FIG. 10 can be released from the conductive film 3 on the protruded face F2 to the electrodes 4 on the principle face F1 via the conductive film 3 on the lateral face portion F3a.

Other configurations of the second embodiment may be identical to corresponding ones of the first embodiment. Accordingly, the template substrate 1 according to the second embodiment can achieve effects identical to those of the template substrate 1 according to the first embodiment.

Third Embodiment: Template Substrate 1

Figure 24:
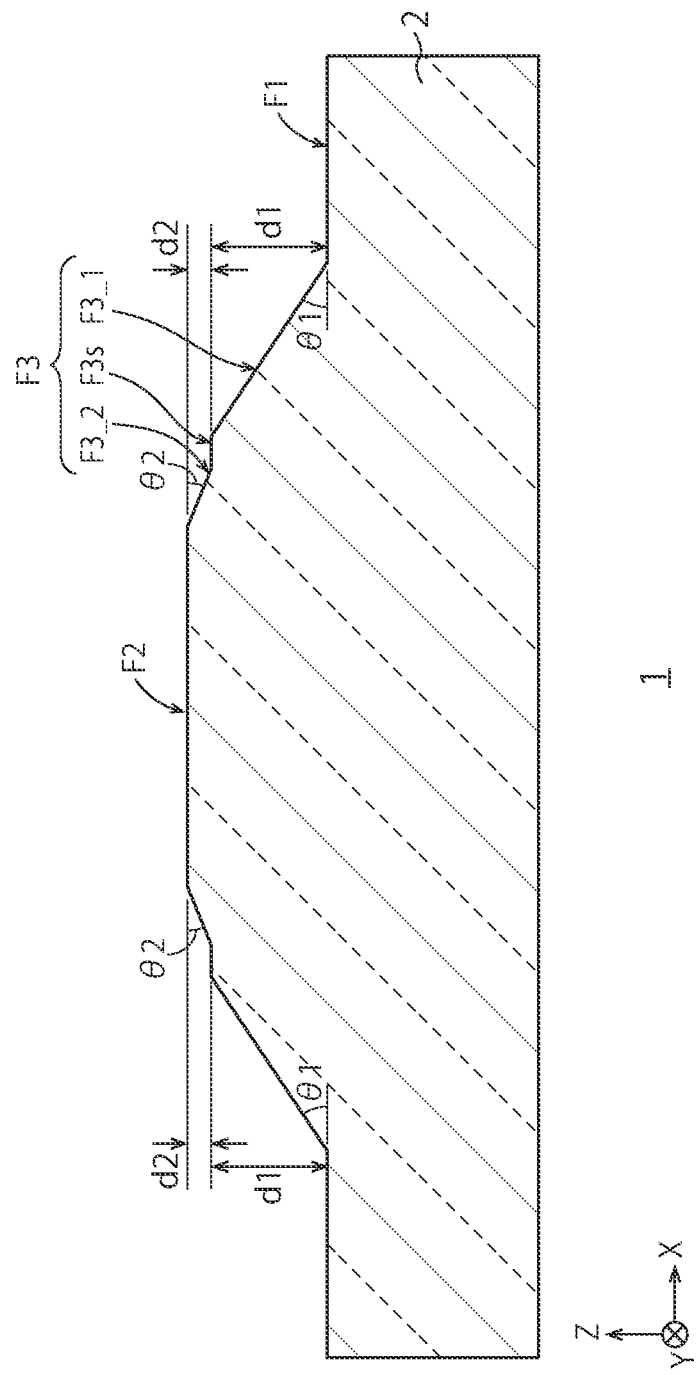
FIG. 24 is a sectional view illustrating a configuration example of a template substrate according to a third embodiment.

FIG. 24 is a sectional view illustrating a configuration example of the template substrate 1 according to a third embodiment. In the third embodiment, the lateral face F3 is formed in a stepped manner and is constituted of a plurality of inclined faces. For example, the lateral face F3 includes an inclined face F3_1, an inclined face F3_2, and a step face F3s. The inclined face F3_1 is connected to the principle face F1 and is inclined at an angle θ1 with the plane of the principle face F1. The inclined face F3_2 is connected to the protruded face F2 and is inclined at an angle θ2 with the plane of the protruded face F2. The step face F3s connects the inclined face F3_1 and the inclined face F3_2 to each other and is a face (a flat face) substantially parallel to the principle face F1 and the protruded face F2. That is, the step face F3s has angles with the principle face F1 and the protruded face F2 smaller than the angles θ1 and θ2, respectively. Accordingly, the lateral face F3 is constituted of a plurality of faces inclined at different angles (or flat) including the inclined face F3_1, the step face F3s, and the inclined face F3_2. Although not illustrated in FIG. 24, the conductive film 3 illustrated in FIG. 23 is provided also on the template substrate 1 in FIG. 24 when measurement and inspection of a pattern on a template are to be performed.

The angles θ1 and θ2 can be equal or may be different from each other. When the angle θ2 is smaller than the angle θ1, more places are brought to contact with the resist on the semiconductor substrate in the NIL process of the semiconductor substrate and the distance between transfer patterns (shots) needs to be larger. In order to decrease the distance between transfer patterns (shots), the angle θ2 is preferably larger than the angle θ1. The angle θ1 is, for example, between 20 degrees and 60 degrees and the angle θ2 is, for example, between 40 degrees and 80 degrees. Reasons thereof are to decrease the resistance value of the conductive film 3 and to narrow the interval between adjacent transfer patterns similarly in the first embodiment. It is preferable that the angle θ2 affecting the distance between transfer patterns be relatively large and it is desirable that the angle θ1 be smaller to reduce the overall resistance value of the conductive film 3.

A thickness (height) d1 from the principle face F1 to the step face F3s and a thickness (height) d2 from the step face F3s to the protruded face F2 can be equal or may be different from each other.

Other configurations of the third embodiment may be identical to corresponding ones of the first embodiment. Accordingly, the template substrate 1 according to the third embodiment can also achieve effects identical to those of the template substrate 1 according to the first embodiment.

A manufacturing method of the template substrate 1 according to the third embodiment is explained next.

FIGS. 25 to 28 are sectional views illustrating an example of the manufacturing method of the template substrate 1 according to the third embodiment.

First, a sacrificial layer 110 is formed on the principle face F1 of the substrate 2, and a mask material 111 is formed on the sacrificial layer 110. A material having a higher etching rate than those of the substrate 2 and the mask material 111 is used as the sacrificial layer 110. For example, a silicon dioxide film is used as the sacrificial layer 110. A material being higher than the substrate 2 and lower than the sacrificial layer 110 in the etching rate is used as the mask material 111. For example, a metallic material such as chrome is used as the mask material 111.

Figure 25:
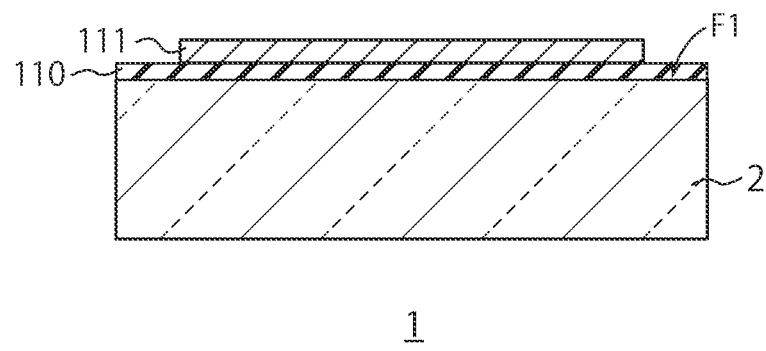
FIG. 25 is a sectional view illustrating an example of a manufacturing method of a template substrate according to the third embodiment.

Next, the mask material 111 is processed into a pattern of a formation region for a mesa structure using a lithography technique (for example, the laser lithography method, the electron beam lithography method, or the photolithography method) and an etching technique. Accordingly, the structure illustrated in FIG. 25 is obtained.

Figure 26:
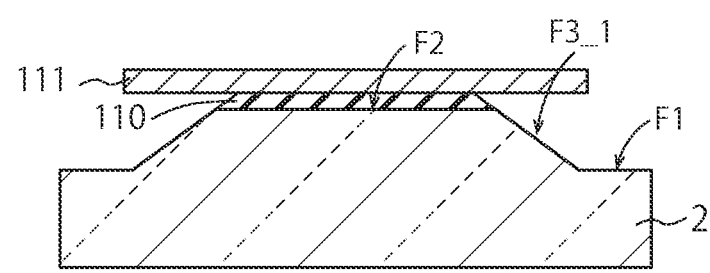
FIG. 26 is a sectional view illustrating another example of the manufacturing method of a template substrate according to the third embodiment.

Next, the substrate 2 and the sacrificial layer 110 are wet-etched with the DHF or the BHF while the mask material 111 is used as a mask. Accordingly, the sacrificial layer 110 under the mask material 111 is isotropically etched from the end portion and the principle face F1 of the substrate 2 under the sacrificial layer 110 is also isotropically etched as illustrated in FIG. 26. The substrate 2 under the mask material 111 is etched and the inclined face F3_1 is formed.

Figure 27:
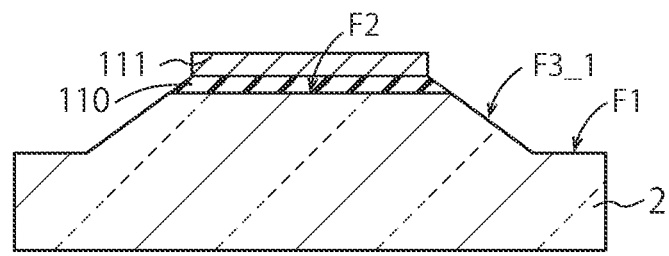
FIG. 27 is a sectional view illustrating another example of the manufacturing method of a template substrate according to the third embodiment.

Next, the mask material 111 is processed into a pattern of a formation region for the protruded face F2 using the lithography technique and the etching technique. At this time, the size of the mask material 111 is formed to be smaller than the sacrificial layer 110 by the step face F3s in a planar view as viewed from the Z direction. Accordingly, the structure illustrated in FIG. 27 is obtained. At the time of obtaining this structure, the whole mask material 111 may be once removed after the first wet etching, and the material of a mask material may be subsequently deposited again on the entire upper surface of the substrate 2 to process this material into the pattern of the formation region for the protruded face F2 to be formed as the mask material 111.

Figure 28:
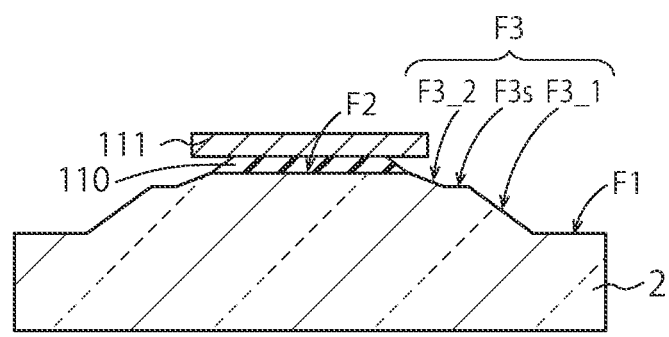
FIG. 28 is a sectional view illustrating another example of the manufacturing method of a template substrate according to the third embodiment.

Next, the substrate 2 and the sacrificial layer 110 are wet-etched again with the DHF or the BHF while the mask material 111 is used as a mask. The sacrificial layer 110 under the mask material 111 is isotropically etched from the end portion and the principle face F1 of the substrate 2 under the sacrificial layer 110 is also isotropically etched as illustrated in FIG. 28. With the isotropic etching of the substrate 2 under the mask material 111, the inclined face F3_2 is formed. The step face F3s is formed between the inclined faces F3_1 and F3_2.

The mask material 111 and the sacrificial layer 110 are subsequently removed, whereby the template substrate 1 according to the third embodiment is completed.

When the adhesion between the substrate 2 and the mask material 111 is poor, the inclined faces F3_1 and F3_2 can be formed in some cases even if the sacrificial layer 110 is omitted. The third embodiment is applicable to other embodiments.

Fourth Embodiment: Template 10

Figure 29:
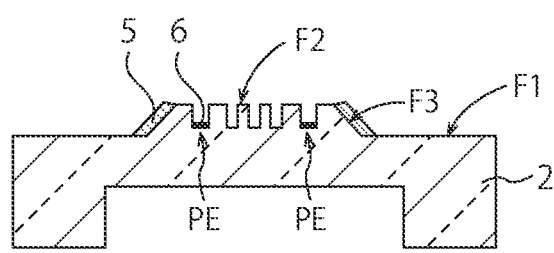
FIG. 29 is a sectional view illustrating a configuration example of a template according to a fourth embodiment.

FIG. 29 is a sectional view illustrating a configuration example of the template 10 according to a fourth embodiment. In the fourth embodiment, the light-shielding film 5 is provided on the lateral face F3. The template 10 illustrated in FIG. 20 includes the light-shielding film 5 or the mark film 6 on the lateral face F3 and the principle face F1. In contrast thereto, the template 10 according to the fourth embodiment includes the light-shielding film 5 on the lateral face F3 and does not include the light-shielding film 5 on the principle face F1.

In this case, when the protruded face F2 of the template 10 is pressed against a resist film on a semiconductor wafer and UV light is exposed to the resist film, the light-shielding film 5 blocks UV light from the lateral face F3 and therefore the resist film can be irradiated with only UV light from the protruded face F2. This suppresses leakage of the UV light to adjacent other transfer patterns.

Fifth Embodiment: Template 10

Figure 30:
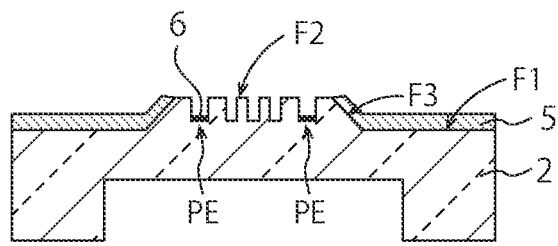
FIG. 30 is a sectional view illustrating a configuration example of a template according to a fifth embodiment.

FIG. 30 is a sectional view illustrating a configuration example of the template 10 according to a fifth embodiment. In the fifth embodiment, the light-shielding film 5 is provided on the principle face F1 and the lateral face F3. The light-shielding film 5 on the principle face F1 and the light-shielding film 5 on the lateral face F3 are continuous and are electrically connected. The light-shielding film 5 is also a conductive film. Accordingly, electric charges from a resist film on a semiconductor wafer can be released to the ground from the electrodes 4 via the light-shielding film 5. Therefore, charge-up on the template 10 can be suppressed.

Since the light-shielding film 5 is provided on the lateral face F3 similarly in the fourth embodiment, leakage of UV light to a formation region for adjacent other transfer patterns can be suppressed.

Sixth Embodiment

Figure 31:
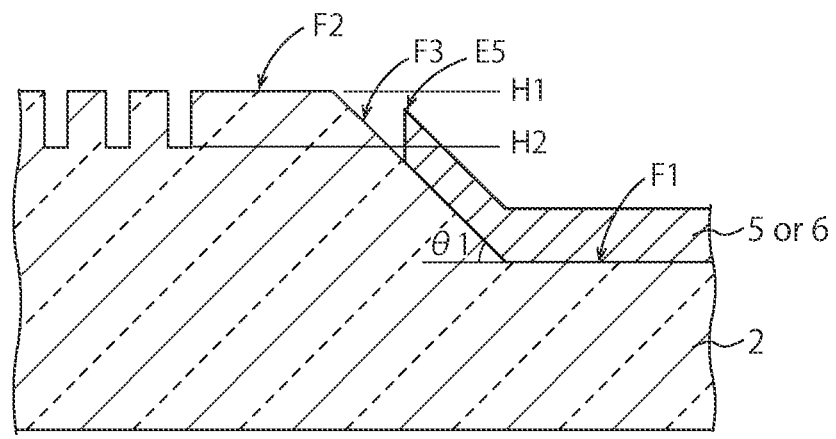
FIG. 31 is a sectional view illustrating a configuration example of a template according to a sixth embodiment.
Figure 31:
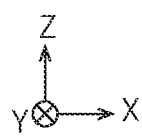

FIG. 31 is a sectional view illustrating a configuration example of the template 10 according to a sixth embodiment. In a case in which the light-shielding film 5 or the mark film 6 is provided on the lateral face F3 as illustrated in FIG. 20 or 30, an end E5 of the light-shielding film 5 or the mark film 6 is protruded in the Z direction from the protruded face F2 in some cases. In these cases, there is a risk that the end E5 of the light-shielding film 5 or the mark film 6 pierces through a resist film on a semiconductor wafer to be brought to contact with a structure on the semiconductor wafer and damage the structure on the semiconductor wafer in the NIL process.

On the other hand, when the end E5 of the light-shielding film 5 or the mark film 6 is at a location lower in the Z direction than the bottom portion of the pattern on the protruded face F2, there is a risk that the light-shielding film 5 or the mark film 6 cannot be brought to contact with the resist film on the semiconductor wafer. In this case, the light-shielding film 5 or the mark film 6 cannot pass electric charges from the resist film to the ground.

Therefore, the end E5 of the light-shielding film 5 or the mark film 6 is preferably positioned between a height level H1 of the protruded face F2 (the upper surface of the transfer pattern) and a height level H2 of the bottom surface of the transfer pattern. This enables the light-shielding film 5 or the mark film 6 to be brought to contact with the resist film and release electric charges from the resist to the ground without damaging the structure of the semiconductor wafer.

Seventh Embodiment: Pattern Forming Method

Figure 32:
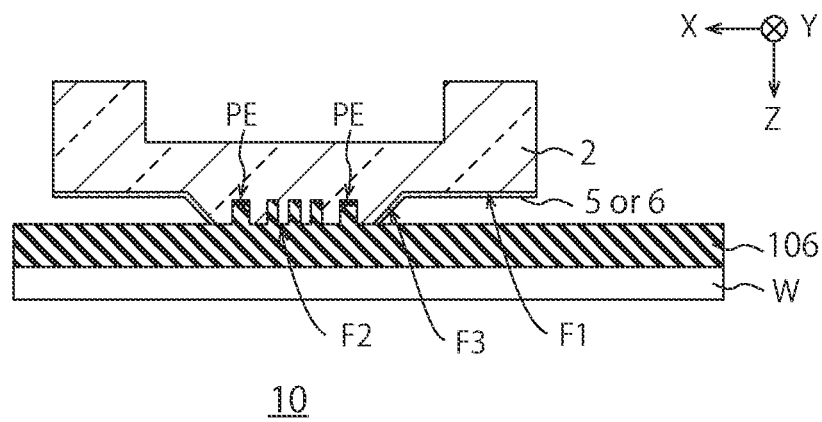
FIG. 32 is a sectional view illustrating an example of a pattern forming method according to a seventh embodiment.
Figure 33:
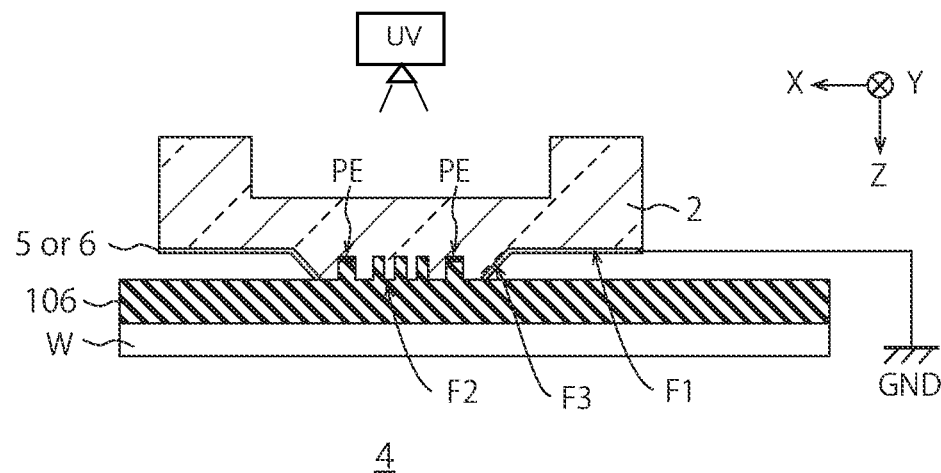
FIG. 33 is a sectional view illustrating an example of the pattern forming method in continuation from FIG. 32.
Figure 34:
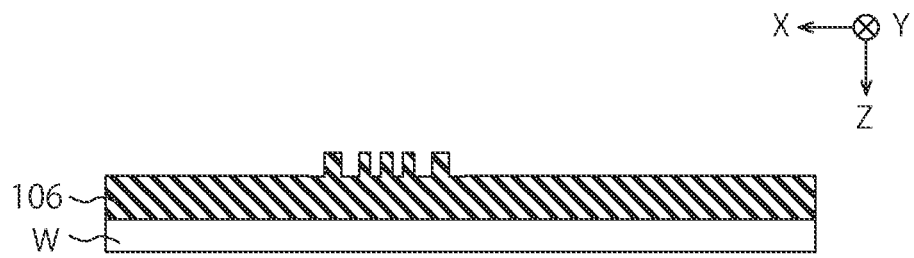
FIG. 34 is a sectional view illustrating an example of the pattern forming method in continuation from FIG. 33.

FIGS. 32 to 34 are sectional views illustrating an example of a pattern forming method according to a seventh embodiment. In the seventh embodiment, a transfer pattern of the template 10 is transferred to a resist film 106 provided on a semiconductor wafer W using the NIL method.

First, the resist film 106 is applied on the semiconductor wafer W. As illustrated in FIG. 32, the protruded face F2 having the mesa structure of the template 10 is pressed against the resist film 106.

Next, the resist film 106 is irradiated with UV light from a UV generation apparatus 200 as illustrated in FIG. 33. At this time, the UV light is irradiated from the core-out portion 7 on the rear surface side of the template 10 and is irradiated to the resist film 106 via the translucent substrate 2. Accordingly, the resist film 106 is cured. At this time, the light-shielding film 5 or the mark film 6 is connected to ground GND via the electrodes 4 and is grounded. Electric charges generated due to static electricity between the resist film 106 and the substrate 2 of the template 10 are released to the ground via the light-shielding film 5 or the mark film 6. Therefore, the template 10 can be suppressed from being charged up and be damaged.

Next, the template 10 is separated from the resist film 106 as illustrated in FIG. 34. Since the resist film 106 has been cured at this time, the transfer pattern of the template 10 is transferred to the resist film 106. This transfer processing is repeatedly performed (step and repeat) also to other shot regions of the surface of the semiconductor wafer W.

This pattern forming method can be used in a lithography process for manufacturing a semiconductor device. The semiconductor wafer W or a material thereon can be processed into a desired pattern by an etching technique or the like while the patterned resist film 106 is used as a mask.

Figure 35:
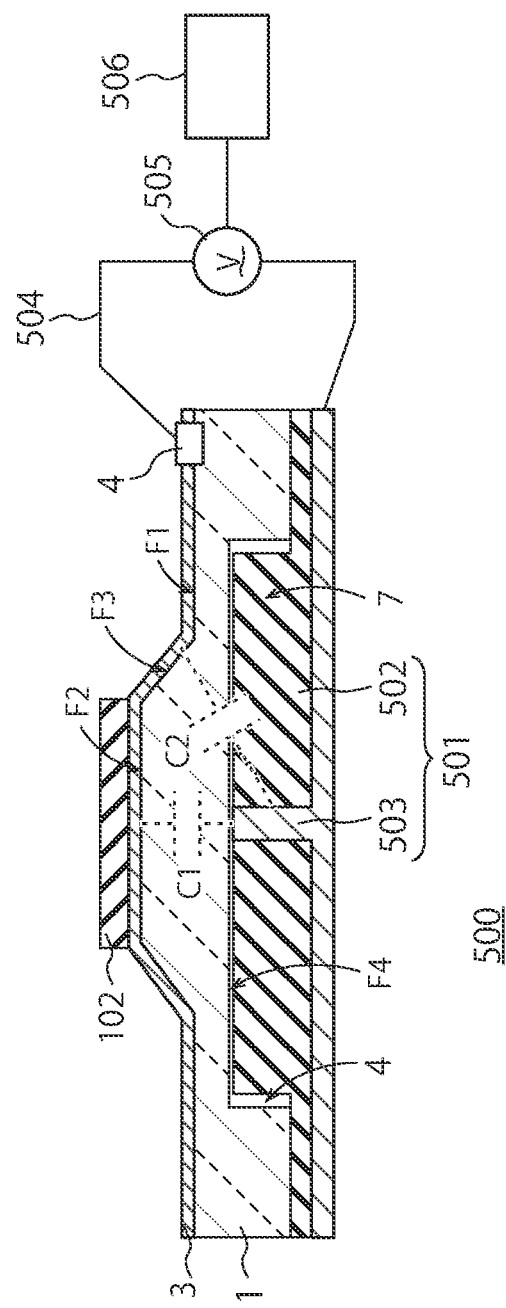
FIG. 35 is a block diagram illustrating an example of a measuring apparatus for a template substrate.

Eighth Embodiment: Measuring Apparatus and Measuring Method for Template Substrate FIG. 35 is a block diagram illustrating an example of a measuring apparatus 500 for the template substrate 1. The measuring apparatus 500 is an LCR meter including a holder 501, a supporter 502, electrode parts 503 and 504, an AC voltage source 505, and a measuring computer 506. The measuring apparatus 500 measures impedance between the conductive film 3 on the template substrate 1 and the electrode part 503 arranged in a central portion of the core-out portion 7 of the template substrate 1. As to whether the conductive film 3 on the protruded face F2 is electrically connected to the electrode part 504 via the conductive film 3 on the lateral face F3 is thereby checked.

The holder 501 is configured to be capable of holding the template substrate 1 according to any of the embodiments described above. For example, when the template substrate 1 has the core-out portion (concave portion) 7 on a rear surface F4 on the opposite side to the protruded face F2, the holder 501 has a convex shape corresponding to the core-out portion (concave portion) 7. By mounting the template substrate 1 so as to fit the core-out portion 7 of the template substrate 1 with the convex portion of the holder 501, the template substrate 1 is fixed at a predetermined location on the holder 501. This fixes the relative location of the electrode part 503 with respect to the template substrate 1 and the impedance described above can be accurately measured. Therefore, whether the conductive film 3 on the protruded face F2 is electrically connected to the electrode part 504 can be accurately determined.

The holder 501 includes the supporter 502 and the electrode part 503. The supporter 502 supports the template substrate 1 from the rear surface F4. For example, an insulating material such as resin is used as the supporter 502. The electrode part 503 is arranged in a central portion of the holder 501 to face immediately below the rear surface F4 of the template substrate 1. Accordingly, the electrode part 503 is arranged to be protruded toward the central portion of the core-out portion 7 in the central portion of the holder 501 and to be close to the conductive film 3 on the protruded face F2 of the template substrate 1. Therefore, a difference between the impedance described above in a case in which the conductive film 3 is electrically connected on the lateral face F3 and the impedance described above in a case in which the conductive film 3 is electrically disconnected on the lateral face F3 is more apparent. For example, a conductive metallic material such as copper is used as the electrode part 503. The electrode part 503 may be provided also on the bottom surface of the supporter 502. However, the portion of the electrode part 503 on the bottom surface of the supporter 502 may be omitted.

The electrode part 504 can be a probe electrically connectable to the conductive film 3 via the electrodes 4. For example, a conductive metallic material such as copper is used as the electrode part 504.

The voltage source 505 is electrically connected to each of the electrode parts 503 and 504 and applies an AC voltage between the electrode part 503 and the electrode part 504. Accordingly, an AC current corresponding to a capacitance between the conductive film 3 and the electrode part 503 flows.

The measuring computer 506 measures impedance between the conductive film 3 and the electrode part 503 from the measured AC voltage and AC current. The measuring computer 506 calculates electrostatic capacitance between the conductive film 3 and the electrode part 503 on the basis of the impedance and determines, for example, whether the conductive film 3 on the protruded face F2 is electrically connected to the electrodes 4. For example, when the conductive film 3 on the protruded face F2 is electrically connected to the electrodes 4, the electrostatic capacitance between the conductive film 3 and the electrode part 503 is C1. For example, when the conductive film 3 on the protruded face F2 is electrically disconnected from the electrodes 4 on the lateral face F3, the electrostatic capacitance between the conductive film 3 and the electrode part 503 is C2 (C2<C1). The measuring computer 506 can determine whether the conductive film 3 on the protruded face F2 is electrically connected to the electrodes 4 on the basis of a difference between the electrostatic capacitances C1 and C2. The measuring computer 506 can be, for example, a CPU (Central Processing Unit) or a computer.

This impedance measurement can be performed in any of the processes illustrated in FIGS. 7 to 9. For example, the resist film 102 is formed on the conductive film 3 on the protruded face F2 of the template substrate 1 in FIG. 7, and the resist film 102 is patterned using a lithography technique (the NIL method, a voltage selection lithography method, or the photolithography method) as illustrated in FIG. 9. Next, the lithography measurement according to the present embodiment is performed and the EB curing is subsequently performed as illustrated in FIG. 10. This enables the EB curing to be performed after confirming that the conductive film 3 on the protruded face F2 is connected to the electrodes 4. As a result, accumulation of electric charges in the conductive film 3 on the protruded face F2 can be suppressed to suppress the template substrate 1 from being damaged. It can also be determined not to perform the EB curing when the conductive film 3 on the protruded face F2 is electrically disconnected from the electrodes 4.

The processes explained with reference to FIGS. 11 to 20 are subsequently performed, and the template 10 is thereby completed. The AC power source is used in the present embodiment. However, a DC power source may be used to cause a constant current to flow through the electrostatic capacitance between the conductive film 3 and the electrode part 503 and measure a charging time and a discharging time of the electrostatic capacitance. Accordingly, the measuring computer 506 can determine the electrostatic capacitance between the conductive film 3 and the electrode part 503 on the basis of the length of the charging time or the discharging time. The measuring computer 506 may directly determine whether the conductive film 3 on the protruded face F2 is electrically connected to the electrodes 4 on the basis of the length of the charging time or the discharging time.

Two or more embodiments arbitrarily selected from the embodiments described above may be combined with one another.

ADDITIONAL REMARKS

(24) A pattern forming method may include:
bringing the second face of the template of Claim 22 to contact with a transfer target;
curing the transfer target; and
separating the second face of the template from the transfer target.
(25) The method of (24), wherein the second material film may be connected to a reference potential source when the second face of the template is brought to contact with a transfer material.
(26) A manufacturing method of a semiconductor device, the method may include:
forming a resist film on a substrate;
bringing the second face of the template of Claim 22 to contact with the resist film;
curing the resist film; and
separating the second face of the template from the resist film.
(27) The method of (26), wherein the second material film may be connected to a reference potential source when the second face of the template is brought to contact with the resist film.
(28) A measuring apparatus may include:
a holder configured to hold a template according to Claim 1;
a first electrode part electrically connectable to a first material film on the template;
a second electrode part provided in the holder and arranged on a third surface side on an opposite side to the second face of the template;
a power source configured to apply power between the first electrode part and the second electrode part; and
a measuring part configured to measure impedance between the first material film and the second electrode part.
(29) The apparatus of (28), wherein
the holder may have a convex shape corresponding to a concave portion provided on the third surface of the template, and
the second electrode part may be arranged in a central portion of the holder to face immediately below the third surface of the template.
(30) A measuring method using a measuring apparatus may include a holder holding a template, a first electrode part, a second electrode part provided in the holder, and a voltage source applying an AC voltage between the first electrode part and the second electrode part. The method may include:
mounting the template according to Claim 1 on the holder;
electrically connecting the first electrode part to the first material film of the template;
applying power between the first electrode part and the second electrode part; and
measuring impedance between the first material film and the second electrode part.
(31) The method of (30) further may include calculating electrostatic capacitance between the first material film and the second electrode part on a basis of the impedance.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A template comprising:
a first substrate comprising a first face, a second face protruded from a portion of the first face, and a lateral face connecting the second face and the first face to each other; and
a first material film provided at least on each of the first face and the lateral face,
wherein the lateral face comprises:
a first inclined face connecting to the first face and inclined at a first angle with the first face;

a second inclined face connecting to the second face and inclined at a second angle with the second face; and a step face positioned between the first inclined face and the second inclined face and having an angle with the first face or the second face smaller than the first angle or the second angle, and wherein:
the second face is a highest surface of the first substrate,
the first substrate has a transfer pattern in a lithography process on the second face, and
one end of the first material film is positioned between an upper surface of a protruded portion of the transfer pattern and a bottom surface of a recessed portion thereof.

2. The template of claim 1, wherein
the first angle is larger than 20 degrees and smaller than 80 degrees, and
the second angle is larger than 20 degrees and smaller than 80 degrees.

3. The template of claim 1, wherein
the first substrate includes quartz, and
the first material film includes chrome.

4. The template of claim 1, wherein the lateral face widens outwardly from a center of the second face from the second face toward the first face on a cross section perpendicular to the second face.

* * * * *